United States Patent
Sato et al.

(10) Patent No.: US 10,927,460 B2
(45) Date of Patent: Feb. 23, 2021

(54) RAW MATERIAL FOR FORMING THIN FILM, AND METHOD FOR MANUFACTURING THIN FILM

(71) Applicant: ADEKA CORPORATION, Tokyo (JP)

(72) Inventors: Hiroki Sato, Tokyo (JP); Naoki Yamada, Tokyo (JP); Tsubasa Shiratori, Tokyo (JP); Haruyoshi Sato, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 106 days.

(21) Appl. No.: 16/302,895

(22) PCT Filed: Feb. 27, 2017

(86) PCT No.: PCT/JP2017/007483
§ 371 (c)(1),
(2) Date: Nov. 19, 2018

(87) PCT Pub. No.: WO2017/203775
PCT Pub. Date: Nov. 30, 2017

(65) Prior Publication Data
US 2019/0292663 A1    Sep. 26, 2019

(30) Foreign Application Priority Data

May 23, 2016   (JP) ................. 2016-102628

(51) Int. Cl.
C23C 16/455 (2006.01)
C23C 16/40 (2006.01)

(52) U.S. Cl.
CPC ........ *C23C 16/45553* (2013.01); *C23C 16/40* (2013.01); *C23C 16/405* (2013.01)

(58) Field of Classification Search
CPC .............................................. C23C 16/45553
See application file for complete search history.

(56) References Cited

U.S. PATENT DOCUMENTS

2013/0337659 A1* 12/2013 Ahn ................. C23C 16/18
                                                   438/785
2016/0273103 A1*  9/2016 Moon ................ C07F 7/003

FOREIGN PATENT DOCUMENTS

JP      2014-510733       5/2014
KR      10-1263454       11/2013
KR      10-2014-0078534   6/2014

OTHER PUBLICATIONS

International Search Report dated Jun. 6, 2017 in International (PCT) Patent Application No. PCT/JP2017/007483.

(Continued)

*Primary Examiner* — Joseph A Miller, Jr.
(74) *Attorney, Agent, or Firm* — Wenderoth, Lind & Ponack, L.L.P.

(57) ABSTRACT

A raw material for forming a thin film that includes a compound represented by General Formula (1) below.

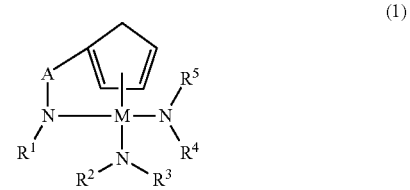

(1)

In the formula, $R^1$ represents a linear or branched alkyl group having 2 to 4 carbon atoms; $R^2$ to $R^5$ each independently represent a linear or branched alkyl group having 1 to 4 carbon atoms; A represents an alkanediyl group having 1 to 4 carbon atoms; and M represents titanium, zirconium or hafnium. Provided that when M represents zirconium, A represents an alkanediyl group having 3 or 4 carbon atoms.

(Continued)

When M represents titanium or hafnium, it is preferred that A represents an alkanediyl group having 2 or 3 carbon atoms. When M represents zirconium, it is preferred that A represent an alkanediyl group having 3 carbon atoms.

4 Claims, 4 Drawing Sheets

(56) References Cited

OTHER PUBLICATIONS

Chirinos et al., "Ethene homo- and ethene/propene copolymerization using a MAO activated cyclopentadienyl-amido half-sandwich complex", Macromolecular Chemistry and Physics, 2000, vol. 201, pp. 2581-2585.

* cited by examiner

RAW MATERIAL FOR FORMING THIN FILM, AND METHOD FOR MANUFACTURING THIN FILM

TECHNICAL FIELD

The present invention relates to a raw material for forming a thin film that includes a specific compound, and a method for manufacturing a thin film by using the raw material for forming a thin film.

BACKGROUND ART

Thin-film materials including titanium, zirconium or hafnium are used for applications of semiconductors, photocells, TFTs and the like, in particular, are mainly used as high dielectric materials for semiconductor materials.

Examples of methods for manufacturing such thin films include a sputtering method, an ion plating method, a MOD method such as a coating pyrolysis method and a sol-gel method, and a chemical vapor deposition method. The chemical vapor deposition (referred to hereinbelow simply as CVD) method, inclusive of an ALD (Atomic Layer Deposition) method, is an optimum manufacturing process because it has advantages such as being suitable for mass production, exceling in composition controllability and stepwise coating ability, and enabling hybrid accumulation.

A large number of various materials have been reported as metal-supplying sources for use in the chemical vapor deposition method. For example, Patent Document 1 discloses using of a specific zirconium complex as a material that can be used in a CVD or ALD method. Further, Patent Document 2 discloses using of a specific metal complex as a material that can be used in a CVD or ALD method. Patent Documents 1 and 2 do not specifically disclose a raw material for forming a thin film according to the present invention.

Patent Document 1: Korean Patent Registration No. 10-1263454
Patent Document 2: Korean Patent Application Publication No. 10-2014-0078534

SUMMARY OF INVENTION

Technical Problem

When a metal-containing thin film is formed on the surface of a substrate by vaporizing a raw material for chemical vapor deposition, a raw material for forming a thin film with high thermal stability is required, since it is necessary to form a film at high temperature in order to obtain a high-quality thin film. Further, a raw material for forming a thin film that can uniformly form a thin film in a groove having an aspect ratio of about 10 to 200 is required.

Solution to the Problem

The present inventors have carried out investigations and discovered that the abovementioned problems can be solved by a raw material for forming a thin film that includes a specific compound, to achieve the present invention.

The present invention provides a raw material for forming a thin film that includes a compound represented by General Formula (1) below.

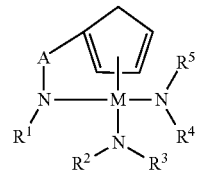

(1)

In the formula, $R^1$ represents a linear or branched alkyl group having 2 to 4 carbon atoms; $R^2$ to $R^5$ each independently represent a linear or branched alkyl group having 1 to 4 carbon atoms; A represents an alkanediyl group having 1 to 4 carbon atoms; and M represents titanium, zirconium or hafnium; provided that when M represents zirconium, A represents an alkanediyl group having 3 or 4 carbon atoms.

The present invention provides a method for manufacturing a thin film, comprising: introducing a vapor including a compound represented by General Formula (1), which is obtained by vaporizing the raw material for forming a thin film described above, into a film formation chamber in which a substrate is disposed; and forming, on a surface of the substrate, a thin film including at least one atom selected from titanium, zirconium and hafnium by inducing decomposition and/or chemical reaction of the compound.

Advantageous Effects of the Invention

In accordance with the present invention, it is possible to obtain a raw material for forming a thin film with high thermal stability, which can uniformly form a high-quality thin film in a groove having an aspect ratio of about 10 to 200. The raw material for forming a thin film in accordance with the present invention is suitable as a raw material for forming a metal thin film by the CVD method. Since the raw material for forming a thin film in accordance with the present invention can be applied to the ALD method, it is particularly suitable as a raw material for forming a thin film by an ALD method, which shows the effects above.

DESCRIPTION OF EMBODIMENTS

Figure 1:
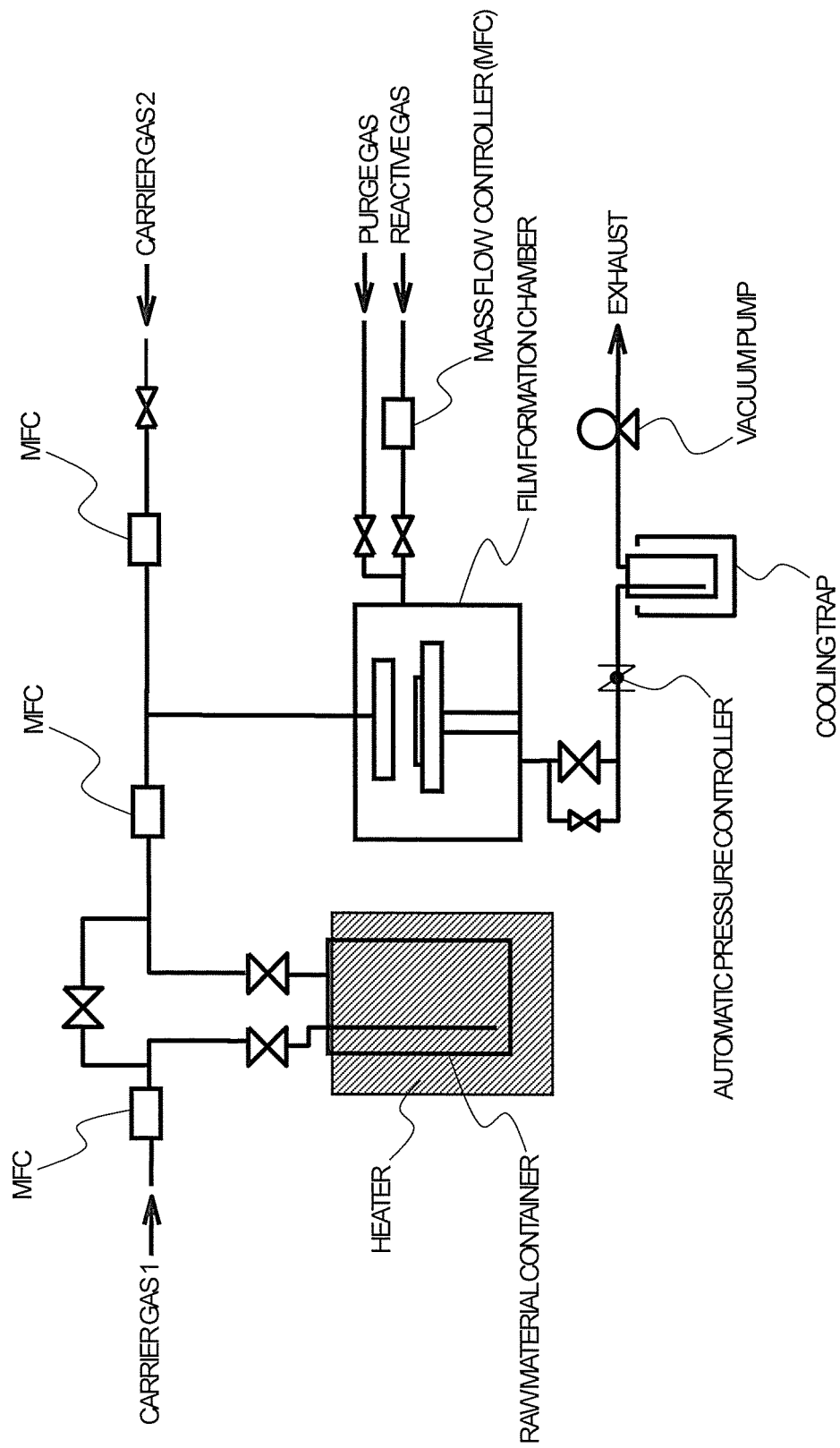
FIG. 1 is a conceptual diagram illustrating an example of a chemical vapor deposition apparatus for use in the method for manufacturing a thin film in the present invention.

The raw material for forming a thin film in accordance with the present invention includes a compound represent by General Formula (1) above. This raw material is advantageous as a precursor for a thin film manufacturing method having a vaporization step, such as the CVD method. This raw material can form a thin film by using the ALD method.

In General Formula (1) above, $R^1$ represents a linear or branched alkyl group having 2 to 4 carbon atoms, $R^2$ to $R^5$ each independently represent a linear or branched alkyl group having 1 to 4 carbon atoms, A represents an alkanediyl group having 1 to 4 carbon atoms, and M represents titanium, zirconium or hafnium. Provided that when M represents zirconium, A represents an alkanediyl group having 3 or 4 carbon atoms.

Examples of the linear or branched alkyl group having 2 to 4 carbon atoms, which is represented by $R^1$, include ethyl, propyl, isopropyl, butyl, isobutyl, sec-butyl, tert-butyl, and the like. Examples of the linear or branched alkyl group having 1 to 4 carbon atoms, which is represented by any of $R^2$ to $R^5$, include methyl, ethyl, propyl, isopropyl, butyl, isobutyl, sec-butyl, tert-butyl, and the like.

Examples of the alkanediyl group having 1 to 4 carbon atoms, which is represented by A, include methylene, ethylene, propane-1,3-diyl, propane-1,2-diyl, butane-1,4-diyl, butane-1,3-diyl, and the like. Examples of the alkanediyl group having 3 or 4 carbon atoms, which is represented by A, include propane-1,3-diyl, propane-1,2-diyl, butane-1,4-diyl, butane-1,3-diyl, and the like.

Where M in General Formula (1) represents titanium or hafnium, it is preferred that A represents an alkanediyl group having 2 or 3 carbon atoms because the compound has high thermal stability and it is possible to uniformly form a thin film in a groove having a high aspect ratio on the substrate when the film is formed by using the ALD method. Among them, it is more preferred that A represents an alkanediyl group having 3 carbon atoms because higher effects of uniformly forming a thin film in a groove having a high aspect ratio on the substrate can be obtained when the film is formed by using the ALD method. Where M represents zirconium, it is preferred that A represents an alkanediyl group having 3 carbon atoms because higher effects of uniformly forming a thin film in a groove having a high aspect ratio on the substrate can be obtained when the film is formed by using the ALD method. It is preferred that $R^1$ in General Formula (1) represents ethyl, isopropyl, sec-butyl or tert-butyl because it is possible to uniformly form a thin film in a groove having a high aspect ratio on the substrate when the film is formed by using the ALD method. It is preferred that at least one of $R^2$ to $R^5$ represents methyl group because a high vapor pressure is realized. Among them, it is more preferred that $R^2$ and $R^4$ represent methyl and $R^3$ and $R^5$ represent ethyl because the compound has a low melting point and good transportability. Further, in the case of a thin film manufacturing method based on the MOD method which does not involve a vaporization step, $R^1$ to $R^5$ and A can be appropriately selected according to the solubility in the solvent used, the thin film formation reaction and the like.

For example, the preferred examples of the compound represented by General Formula (1) include compounds represented by Chemical Formulas No. 1 to No. 88 below. In Chemical Formulas No. 1 to No. 88, "Me" represents methyl group, "Et" represents ethyl group, "$^i$Pr" represents isopropyl group, "$^s$Bu" represents sec-butyl group and "$^t$Bu" represents tert-butyl group.

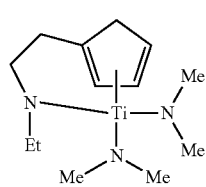

Compound No.1

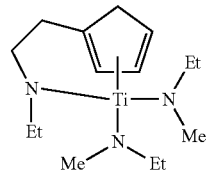

Compound No.2

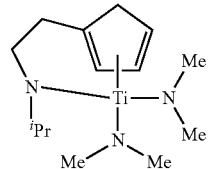

Compound No.3

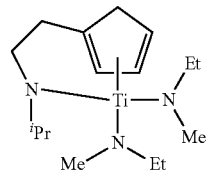

Compound No.4

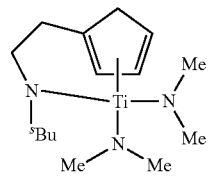

Compound No.5

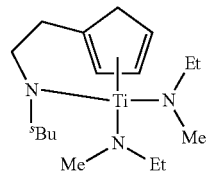

Compound No.6

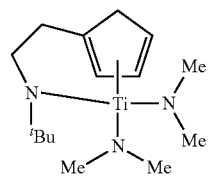

Compound No.7

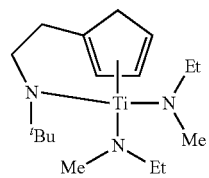

Compound No.8

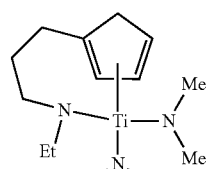

Compound No.9

Compound No.10
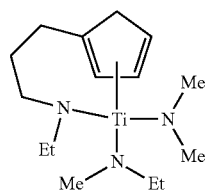
Compound No.11
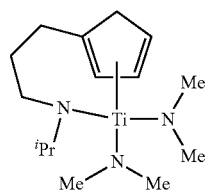
Compound No.12
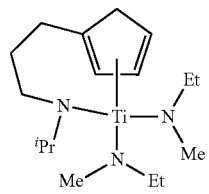
Compound No.13
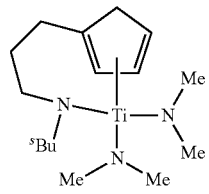
Compound No.14
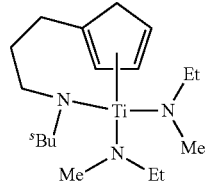
Compound No.15
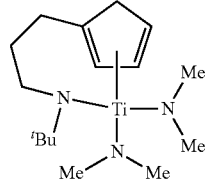
Compound No.16
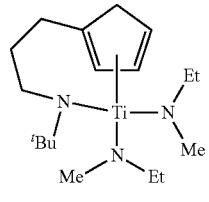
Compound No.17
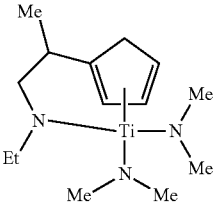
Compound No.18
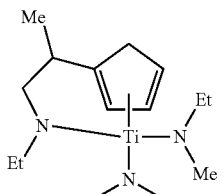
Compound No.19
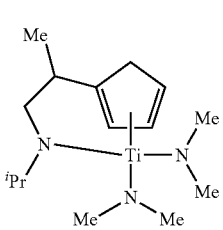
Compound No.20
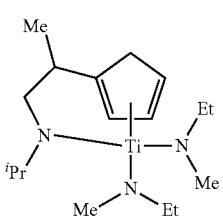
Compound No.21
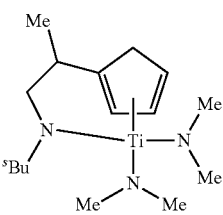
Compound No.22
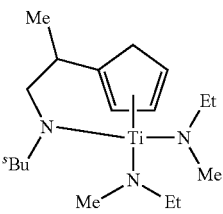
Compound No.23
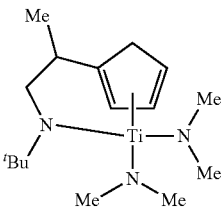
Compound No.24
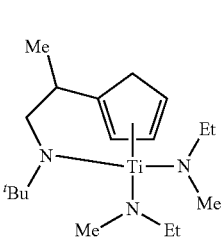

Compound No.25
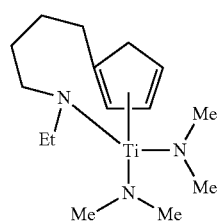
Compound No.26
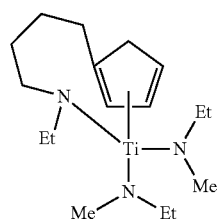
Compound No.27
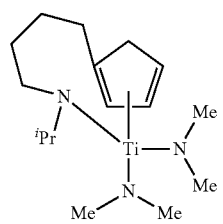
Compound No.28
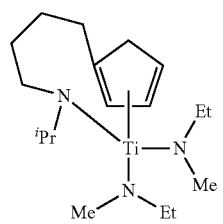
Compound No.29
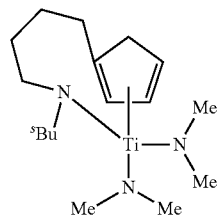
Compound No.30
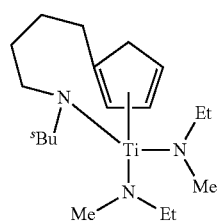
Compound No.31
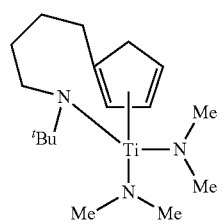
Compound No.32
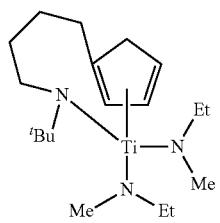
Compound No.33
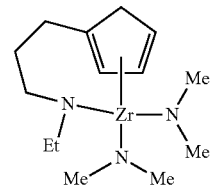
Compound No.34
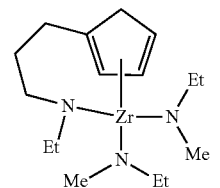
Compound No.35
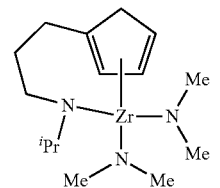
Compound No.36
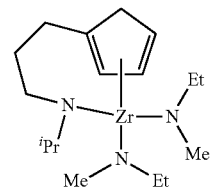
Compound No.37
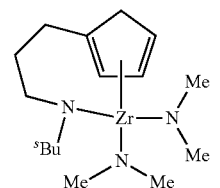
Compound No.38
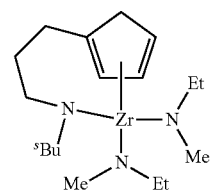
Compound No.39
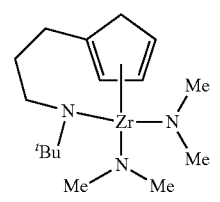

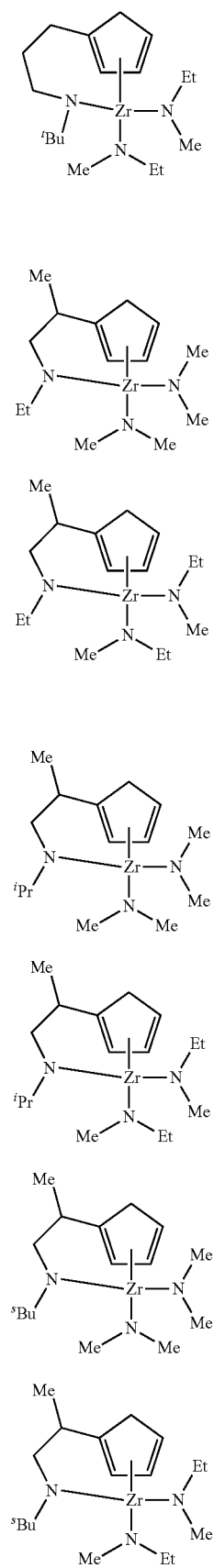
Compound No.40
Compound No.41
Compound No.42
Compound No.43
Compound No.44
Compound No.45
Compound No.46
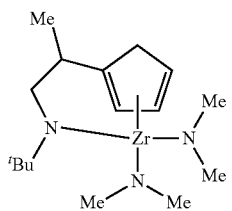
Compound No.47
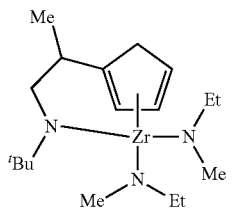
Compound No.48
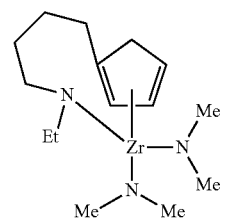
Compound No.49
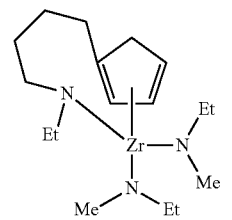
Compound No.50
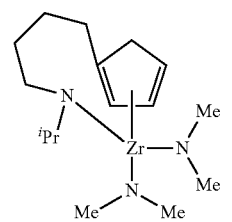
Compound No.51
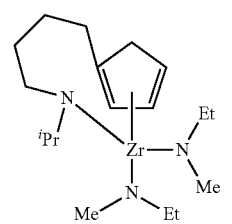
Compound No.52
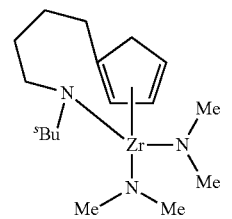
Compound No.53

Compound No.54

Compound No.55

Compound No.56

Compound No.57

Compound No.58

Compound No.59

Compound No.60

Compound No.61

Compound No.62

Compound No.63

Compound No.64

Compound No.65

Compound No.66

Compound No.67

Compound No.68

Compound No.69

Compound No. 70
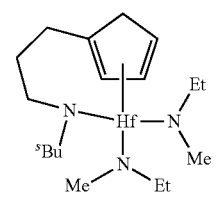
Compound No. 71
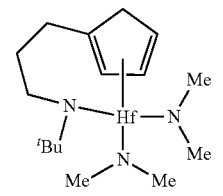
Compound No. 72
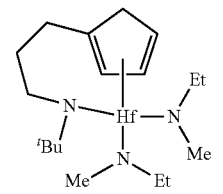
Compound No. 73
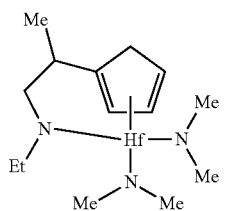
Compound No. 74
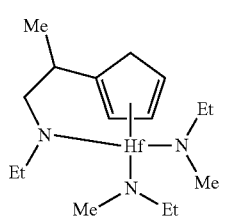
Compound No. 75
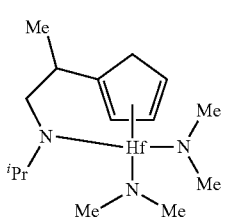
Compound No. 76
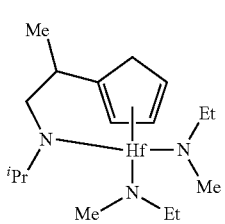
Compound No. 77
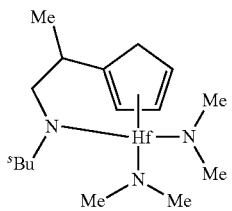
Compound No. 78
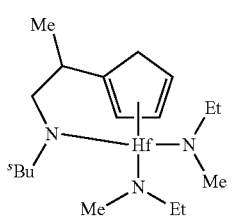
Compound No. 79
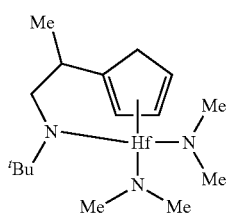
Compound No. 80
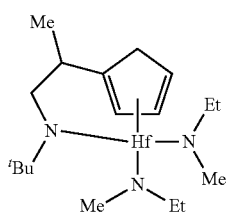
Compound No. 81
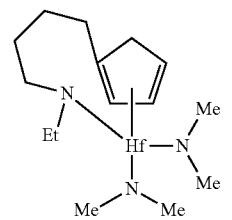
Compound No. 82
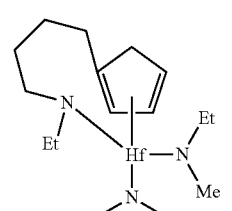
Compound No. 83
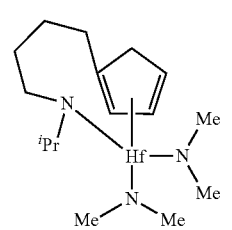

-continued

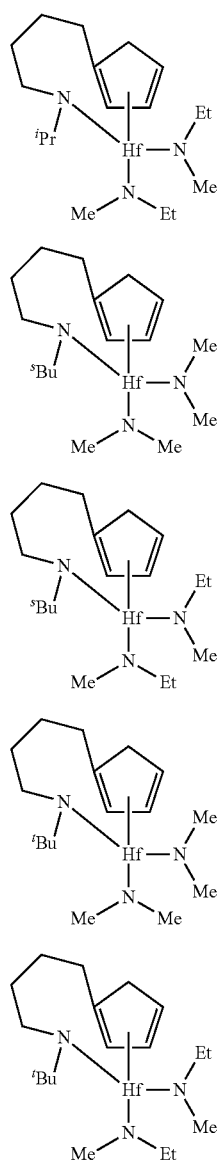

Compound No.84

Compound No.85

Compound No.86

Compound No.87

Compound No.88

The compound represented by General Formula (1), which is contained the raw material for forming a thin film according to the present invention is not particularly restricted by the manufacturing method thereof and can be manufactured by using a well-known reaction. For example, the compound where M is titanium can be manufactured by reacting the corresponding alkylaminoalkylcyclopentadiene compound with tetrakis (dialkylamino) titanium in a solvent such as toluene at a temperature of 10° C. to 50° C. The compound where M is zirconium can be manufactured by reacting the corresponding alkylaminoalkylcyclopentadiene compound with tetrakis (dialkylamino) zirconium in a solvent such as toluene at a temperature of 10° C. to 50° C. The compound where M is hafnium can be manufactured by reacting the corresponding alkylaminoalkylcyclopentadiene compound with tetrakis (dialkylamino) hafnium in a solvent such as toluene at a temperature of 10° C. to 50° C.

The form of the raw material for forming a thin film of the present invention differs depending on the manufacturing process in which the raw material for forming a thin film is to be used. For example, where a thin film including only a metal selected from the group consisting of titanium, zirconium and hafnium is manufactured, the raw material for forming a thin film of the present invention does not include metal compounds other than the compound represented by General Formula (1) or semimetal compounds. Meanwhile, where a thin film including a metal selected from the group consisting of titanium, zirconium and hafnium, and metals other than the metal selected from the group consisting of titanium, zirconium and hafnium and/or semimetals is manufactured, the raw material for forming a thin film of the present invention includes a compound including a metal other than the metal selected from the group consisting of titanium, zirconium and hafnium, and/or a semimetal (can be also referred to hereinbelow as "other precursor"). As will be described hereinbelow, the raw material for forming a thin film of the present invention may additionally include an organic solvent and/or a nucleophilic reagent. Since the raw material for forming a thin film of the present invention is advantageous for the CVD method and ALD method, the raw material is particularly useful as a raw material for chemical vapor deposition (referred to hereinbelow as "CVD").

Where the raw material for forming a thin film of the present invention is a raw material for chemical vapor deposition, the form thereof can be selected, as appropriate, according, e.g., to the delivery and feed method in the CVD method which is to be used.

The delivery and feed method can be a gas delivery method in which a CVD source is vaporized by heating and/or depressurizing the interior of a container in which the source is stored (can be referred to hereinbelow simply as "raw material container"), and the obtained vapor is introduced, optionally together with a carrier gas such as argon, nitrogen, and helium, into a film formation chamber in which a substrate is disposed (can be also referred to hereinbelow as "deposition reaction unit") or a liquid delivery method in which a CVD source is transported in a state of a liquid or solution into a vaporization chamber and vaporized by heating and/or depressurizing in the vaporization chamber, and the vapor is introduced into a film formation chamber. When the gas delivery method is used, the compound itself, which is represented by General Formula (1), can be used as the CVD source. When the liquid delivery method is used, the compound itself, which is represented by General Formula (1), or a solution obtained by dissolving the compound in an organic solvent can be used as the CVD source. Those CVD sources may additionally include the other precursor, a nucleophilic reagent or the like.

Further, CVD of a multicomponent system can be implemented by a method of vaporizing and feeding CVD sources for each component independently (can be also referred to hereinbelow as "single source method") and a method of vaporizing and feeding a mixed raw material obtained by mixing in advance multicomponent raw materials at the desired composition ratio (can be also referred to hereinbelow as "cocktail source method"). When the raw material for forming a thin film of the present invention is used in the cocktail source method, a mixture of the compound represented by General Formula (1) and the other precursor, or a mixed solution obtained by dissolving the mixture in an organic solvent can be used as the CVD source. The mixture or mixed solvent may additionally include a nucleophilic reagent.

The organic solvent is not particularly limited, and well-known typical organic solvents can be used. Examples of the organic solvents include acetates such as ethyl acetate, butyl acetate, and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons such as hexane, cyclohexane, methylcyclohexane, dimethylcyclohexane, ethylcyclohexane, heptane, octane, toluene, and xylene; hydrocarbons including a cyano group such as 1-cyanopropane, 1-cyanobutane, 1-cyanohexane, cyanocyclohexane, cycanobenzene, 1,3-dicyanopropane, 1,4-dicyanobutane, 1,6-dicyanohexane, 1,4-dicyanocyclohexane, and 1,4-dicyanobenzene; pyridine and lutidine. Such organic solvents are used alone or as a mixture of two or more thereof depending on the relationship between the solute solubility, usage temperature, boiling point, and flash point. When such organic solvents are used, the amount of the entire precursor in the CVD source which is a solvent in which the precursor is dissolved in the organic solvent is preferably 0.01 mol/L to 2.0 mol/L, in particular, 0.05 mol/L to 1.0 mol/L. The amount of the entire precursor, as referred to herein, is the amount of the compound represented by General Formula (1) when the raw material for forming a thin film of the present invention does not include a metal compound other than the compound represented by General Formula (1) or a semimetal compound, and is the total amount of the compound represented by General Formula (1) and the other precursor when the raw material for forming a thin film of the present invention includes a compound including other metal and/or a compound including a semimetal in addition to the compound represented by General Formula (1).

When CVD of a multicomponent system is performed, the other precursor which is used together with the raw material for forming a thin film of the present invention is not particularly limited, and any well-known typical precursor which has been used in CVD sources can be used.

Examples of the other precursor include one, or two or more compounds of silicon or a metal selected from a group including compounds having a hydride, a hydroxide, a halide, an azide, an alkyl, an alkenyl, a cycloalkyl, an aryl, an alkynyl, an amino, a dialkylaminoalkyl, a monoalkylamino, a dialkylamino, a diamine, a di(silyl-alkyl)amino, a di(alkyl-silyl)amino, a disilylamino, an alkoxy, an alkoxyalkyl, a hydrazido, a phosphido, a nitrile, a dialkylaminoalkoxy, an alkoxyalkyldialkylamino, a siloxy, a diketonate, a cyclopentadienyl, a silyl, a pyrazolate, a guanidinate, a phosphoguanidinate, an amidinate, a phosphoamidinate, a ketoiminate, a diketoiminate, a carbonyl, and a phosphoamidinate as a ligand.

Examples of metals for the precursor include magnesium, calcium, strontium, barium, radium, scandium, yttrium, vanadium, niobium, tantalum, chromium, molybdenum, tungsten, manganese, iron, osmium, cobalt, rhodium, iridium, nickel, palladium, platinum, copper, silver, gold, zinc, cadmium, aluminum, gallium, indium, germanium, tin, lead, antimony, bismuth, lanthanum, cerium, praseodymium, neodymium, samarium, europium, gadolinium, terbium, dysprosium, holmium, erbium, thulium, and ytterbium.

Such other precursors are well known in the pertinent technical field, and the manufacturing methods thereof are also well known. For example, where an alcohol compound is used as the organic ligand, the precursor can be manufactured by conducting a reaction of the abovementioned inorganic metal salt or a hydrate thereof and the alkali metal alkoxide of the alcohol compound. Examples of the inorganic metal salt and hydrate thereof include metal halides and nitrates, and examples of the alkali metal alkoxides include sodium alkoxide, lithium alkoxide, and potassium alkoxide.

In the case of a single source method, it is preferred that the other precursor is a compound demonstrating thermal and/or oxidative decomposition behavior similar to that of the compound represented by General Formula (1). In the case of a cocktail source method, it is preferred that the precursor has similar thermal and/or oxidative decomposition behavior and also demonstrates no transformations induced by chemical reactions or the like at the time of mixing.

Examples of the other precursor include precursors including rare earth metals. Examples of the precursors including rare earth metals are compounds represented by Formulas (III-1) to (III-3) below.

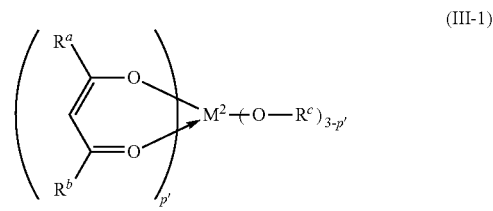

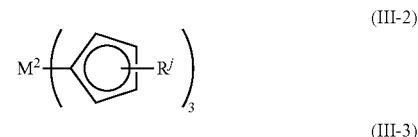

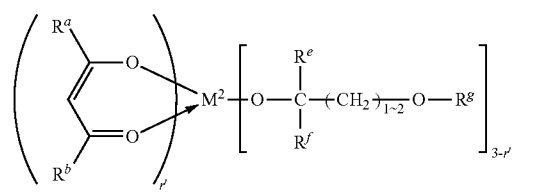

In the formulas, $M^2$ represents a rare earth atom; $R^a$ and $R^b$ each independently represent a $C_{1-20}$ alkyl group which may be substituted with a halogen atom and may contain an oxygen atom in a chain; $R^c$ represents a $C_{1-8}$ alkyl group; $R^e$ and $R^f$ each independently represent a hydrogen atom or a $C_{1-3}$ alkyl group; $R^g$ and $R^j$ each independently represent a $C_{1-4}$ alkyl group; p' represents an integer of 0 to 3; and r' represents an integer of 0 to 2.

Examples of rare earth atoms represented by $M^2$ in the precursor including a rare earth element include scandium, yttrium, lanthanum, cerium, praseodymium, neodymium, samarium, europium, gadolinium, terbium, dysprosium, holmium, erbium, thulium, ytterbium, and lutetium. Examples of the $C_{1-20}$ alkyl group which may be substituted with a halogen atom and may contain an oxygen atom in a chain, this group being represented by $R^a$ and $R^b$, include methyl, ethyl, propyl, isopropyl, butyl, sec-butyl, tert-butyl, isobutyl, pentyl, isopentyl, neopentyl, tert-pentyl, hexyl, cyclohexyl, 1-methylcyclohexyl, heptyl, 3-heptyl, isoheptyl, tert-heptyl, n-octyl, isooctyl, tert-octyl, 2-ethylhexyl, trifluoromethyl, perfluorohexyl, 2-methoxyethyl, 2-ethoxyethyl, 2-butoxyethyl, 2-(2-methoxyethoxy)ethyl, 1-methoxy-1,1-dimethylmethyl, 2-methoxy-1,1-dimethylethyl, 2-ethoxy-1,1-dimethylethyl, 2-isopropoxy-1,1-dimethylethyl, 2-butoxy-1,1- dimethylethyl, and 2-(2-methoxyethoxy)-1,1-dimethylethyl. The $C_{1-8}$ alkyl group as represented by $R^c$ includes methyl, ethyl, propyl, isopropyl, butyl, sec-butyl, tert-butyl, isobutyl, pentyl, isopentyl, neopentyl, tert-pentyl, hexyl, 1-ethylpentyl, cyclohexyl, 1-methylcyclohexyl, heptyl, isoheptyl, tert-heptyl, n-octyl, isooctyl, tert-octyl, and 2-ethylhexyl. Examples of the $C_{1-3}$ alkyl group which is represented by $R^e$ and $R^f$ include methyl, ethyl, propyl, and 2-propyl. Examples of the $C_{1-4}$ alkyl group which is represented by $R^g$, and $R^j$ include methyl, ethyl, propyl, isopropyl, butyl, sec-butyl, tert-butyl, and isobutyl.

If necessary, the raw material for forming a thin film of the present invention may include a nucleophilic reagent to stabilize the compound represented by General Formula (1) and the other precursor. Examples of the nucleophilic reagent include ethylene glycol ethers such as glyme, diglyme, triglyme, and tetraglyme; crown ethers such as 18-crown-6, dicyclohexyl-18-crown-6, 24-crown-8, dicyclohexyl-24-crown-8, and dibenzo-24-crown-8; polyamines such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines such as cyclam and cyclen; heterocyclic compounds such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters such as methyl acetoacetate, ethyl acetoacetate, and 2-methoxyethyl acetoacetate; and β-diketones such as acetylacetone, 2,4-hexanedione, 2,4-heptanedione, 3,5-heptanedione, and dipivaroylmethane. These nucleophilic reagents are used in an amount preferably within a range of 0.1 mole to 10 mole, more preferably 1 mole to 4 mole per mole of the amount of the entire precursor.

In the raw material for forming a thin film of the present invention, the amount of metal element impurities, halogen impurities such as chlorine-containing impurities, and organic impurities, which are different from the components constituting the raw materials, needs to be minimized. The content of the metal element impurities is preferably 100 ppb or less, and more preferably 10 ppb or less for each element, and the total amount of the impurities is preferably 1 ppm or less, and more preferably 100 ppb or less. In particular, when the raw material is used to form a gate insulating layer, a gate film, or a barrier layer of an LSI, it is necessary to reduce the amount of alkali metal elements and alkaline earth metal elements which affect the electric properties of a thin film to be obtained. The amount of the halogen impurities is preferably 100 ppm or less, more preferably 10 ppm or less, and most preferably 1 ppm or less. The total amount of organic impurities is preferably 500 ppm or less, more preferably 50 ppm or less, and most preferably 10 ppm or less. Since moisture causes particle generation in the raw material for chemical vapor deposition or particle generation during thin film formation, it is better to remove moisture as much as possible prior to use from the metal compound, the organic solvent, and the nucleophilic reagent in order to reduce the amount of moisture therein. The amount of moisture in each of the metal compound, the organic solvent, and the nucleophilic reagent is 10 ppm or less, and more preferably 1 ppm or less.

Further, in order to reduce or prevent the particle contamination of the thin film to be formed, it is preferred that the raw material for forming a thin film of the present invention include as few particles as possible. More specifically, in particle measurements with a particle detector of a light scattering type in a liquid phase, the number of particles larger than 0.3 μm is preferably 100 or less in 1 ml of the liquid phase, more preferably the number of particles larger than 0.2 μm is 1000 or less in 1 ml of the liquid phase, and most preferably the number of particles larger than 0.2 μm is 100 or less in 1 ml of the liquid phase.

A method for manufacturing a thin film of the present invention by which a thin film is manufactured by using the raw material for forming a thin film of the present invention is based on the CVD method in which a vapor produced by vaporizing the raw material for forming a thin film of the present invention, and an optionally used reactive gas are introduced into a film formation chamber in which a substrate is disposed, and the precursor is then decomposed and/or chemically reacted on the substrate to grow and deposit a thin film including a metal on the substrate surface. The method for delivering and feeding the raw materials, the deposition method, manufacturing conditions, and manufacturing apparatus are not particularly restricted, and well-known typical conditions and methods can be used.

Examples of the optionally used reactive gas include oxidative gases such as oxygen, ozone, nitrogen dioxide, nitrogen monoxide, water vapor, hydrogen peroxide, formic acid, acetic acid, and acetic anhydride; reductive gases such as hydrogen; and gases producing nitrides, for example, organic amine compounds such as monoalkylamines, dialkylamines, trialkylamines, and alkylenediamines, hydrazine, and ammonia. These gases can be used individually or in combinations of two or more thereof.

Examples of the delivery and feeding methods include the above-described gas delivery method, liquid delivery method, single source method, and cocktail source method.

Examples of the deposition method include thermal CVD in which a source gas or a source gas and a reactive gas are reacted only by heat in order to deposit a thin film; plasma CVD in which heat and plasma are used; photo-excited CVD in which heat and light are used; photo- and plasma-excited CVD in which heat, light and plasma are used; and ALD in which the CVD deposition reaction is separated into elementary steps and deposition is performed step by step at a molecular level.

Examples of the substrate material include silicon, ceramics such as silicon nitride, titanium nitride, tantalum nitride, titanium oxide, titanium nitride ruthenium oxide, zirconium oxide, hafnium oxide, and lanthanum oxide; glass; and metals such as metallic ruthenium. The substrate may be in the form of a sheet, sphere, fibers, and flakes. The substrate surface may be flat or may have a three-dimensional structure such as a trench structure comprising a trench (groove) having an aspect ratio of about 10 to 200.

The manufacturing conditions include the reaction temperature (substrate temperature), reaction pressure, deposition rate, and the like. The reaction temperature is preferably 100° C. or higher, at which the compound represented by General Formula (1) is sufficiently reactive, and more preferably 150° C. to 400° C. Since the compound represented by General Formula (1) can be pyrolyzed at less than 300° C., the reaction temperature is particularly preferably 150° C. to 250° C. The reaction pressure is preferably from atmospheric pressure to 10 Pa for thermal CVD and photo-excited CVD, and preferably from 2000 Pa to 10 Pa when plasma is used.

The deposition rate can be controlled by the raw material feed conditions (vaporization temperature and vaporization pressure), reaction temperature, and reaction pressure. Since a high deposition rate can degrade the properties of the resulting thin film and a low deposition rate can cause problems with productivity, the deposition rate is preferably 0.01 nm/min to 100 nm/min and more preferably 1 nm/min to 50 nm/min. In the ALD method, the control is performed by the number of cycles so as to obtain the desired film thickness.

The temperature or pressure during vaporization of the raw material for forming a thin film can be also considered as the manufacturing condition. The step of obtaining the vapor by vaporizing the raw material for forming a thin film may be performed inside the raw material container or inside the vaporization chamber. In either case, it is preferred that the raw material for forming a thin film of the present invention be evaporated at 0° C. to 150° C. Further, where the raw material for forming a thin film is vaporized to obtain the vapor inside the raw material container or vaporization chamber, it is preferred that the pressure inside the raw material container and the pressure inside the vaporization chamber be 1 Pa to 10,000 Pa.

The method for manufacturing a thin film of the present invention, when it is realized by the ALD method, may include a raw material introduction step in which the raw material for forming a thin film is vaporized to obtain a vapor and the vapor is introduced into the film formation chamber by the abovementioned delivery and feeding method, and also a precursor thin film formation step of forming a precursor thin film on the surface of the substrate with the compound represented by General Formula (1) in the vapor, an evacuation step of evacuating the gas of the unreacted raw material for forming a thin film, and a metal-containing thin film formation step of chemically reacting the precursor thin film with a reactive gas and forming a thin film including the metal on the surface of the substrate.

Each of the abovementioned steps will be described hereinbelow in greater detail with reference to the case of forming a metal oxide thin film. When a metal oxide thin film is formed by the ALD method, initially, the raw material introduction step, which has been explained hereinabove, is performed. The temperature and pressure preferred when vaporizing the raw material for forming a thin film are the same as explained hereinabove. Then, a precursor thin film is formed on the substrate surface with the compound represented by General Formula (1), which is introduced in the deposition reaction unit (precursor thin film formation step). At this time, heat may be applied by heating the substrate or heating the deposition reaction unit. The precursor thin film which is formed in this step is a metal oxide thin film or a thin film generated by decomposition and/or reaction of part of the compound represented by General Formula (1) and has a composition different from the target metal oxide thin film. The substrate temperature employed in this step is preferably from room temperature to 500° C., more preferably from 150° C. to 350° C. The pressure in the system (in the film formation chamber) when this step is performed is preferably 1 Pa to 10,000 Pa, more preferably 10 Pa to 1000 Pa.

The gas of the unreacted raw material for forming a thin film and the byproduct gas are then evacuated from the deposition reaction unit (evacuation step). The gas of the unreacted raw material for forming a thin film and the byproduct gas are ideally completely evacuated from the deposition reaction unit, but such complete evacuation is not always necessary. Examples of the evacuation method include a method of purging the interior of the system with an inactive gas such as nitrogen, helium, and argon, a method of evacuating by depressurizing the interior of the system, and a method in which the aforementioned methods are combined. The degree of depressurization when the depressurization method is used is preferably 0.01 Pa to 300 Pa, more preferably 0.01 Pa to 100 Pa.

The reactive gas is then introduced into the deposition reaction unit and a metal oxide thin film is formed from the precursor thin film, which has been formed in the preceding precursor thin film formation step, under the action of the oxidizing gas or the action of the oxidizing gas and heat (metal oxide-containing thin film formation step). The temperature when heat is used in this step is preferably from room temperature to 500° C., more preferably from 150° C. to 350° C. The pressure in the system (in the film formation chamber) in which this step is performed is preferably 1 Pa to 10,000 Pa, more preferably 10 Pa to 1000 Pa. The raw material for forming a thin film of the present invention has good reactivity with oxidizing gases and can yield a metal oxide thin film.

When the ALD method is used in the above-described manner in the method for manufacturing a thin film of the present invention, thin film deposition performed by a series of operations including the raw material introduction step, precursor thin film formation step, evacuation step, and metal oxide-containing thin film formation step may be taken as one cycle, and such cycles may be repeated a plurality of times till a thin film of a necessary thickness is obtained. In this case, after one cycle is completed, it is preferred that the gas of the unreacted raw material for forming a thin film, the reactive gas (oxidizing gas when a metal oxide thin film is formed), and the byproduct gas be evacuated from the deposition reaction unit in the same manner as in the evacuation step, and the next cycle be thereafter performed.

When a metal oxide thin film is formed by the ALD method, energy such as plasma, light, and voltage may be applied, and a catalyst may be used. The time period for applying the energy and the time period for using the catalyst are not particularly limited. For example, the energy may be applied and the catalyst may be used when the gas of the raw material for forming a thin film of the present invention is introduced in the raw material introduction step, during heating in the precursor thin film formation step or metal oxide-containing thin film formation step, during evacuation of the interior of the system in the evacuation step, when the oxidizing gas is introduced in the metal oxide-containing thin film formation step, and also between the aforementioned steps.

Further, in the method for manufacturing a thin film of the present invention, annealing may be performed under an inactive gas atmosphere, an oxidizing atmosphere, or a reducing atmosphere after the thin film deposition to obtain better electric properties, and a reflow step may be employed when bump embedding is needed. In this case, the temperature is 2000° C. to 1000° C., preferably 250° C. to 500° C.

Figure 2:
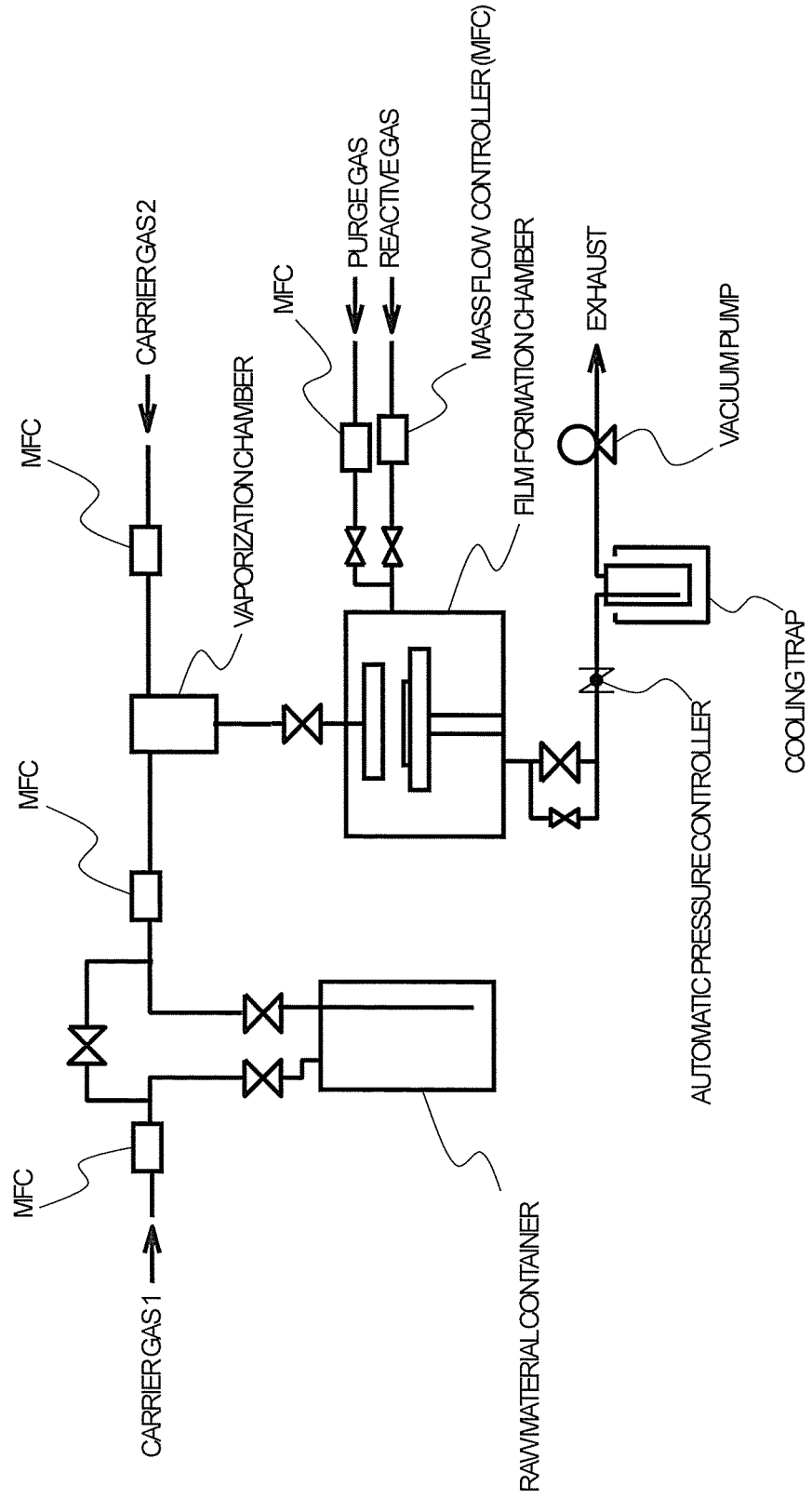
FIG. 2 is a conceptual diagram illustrating another example of a chemical vapor deposition apparatus for use in the method for manufacturing a thin film in the present invention.
Figure 3:
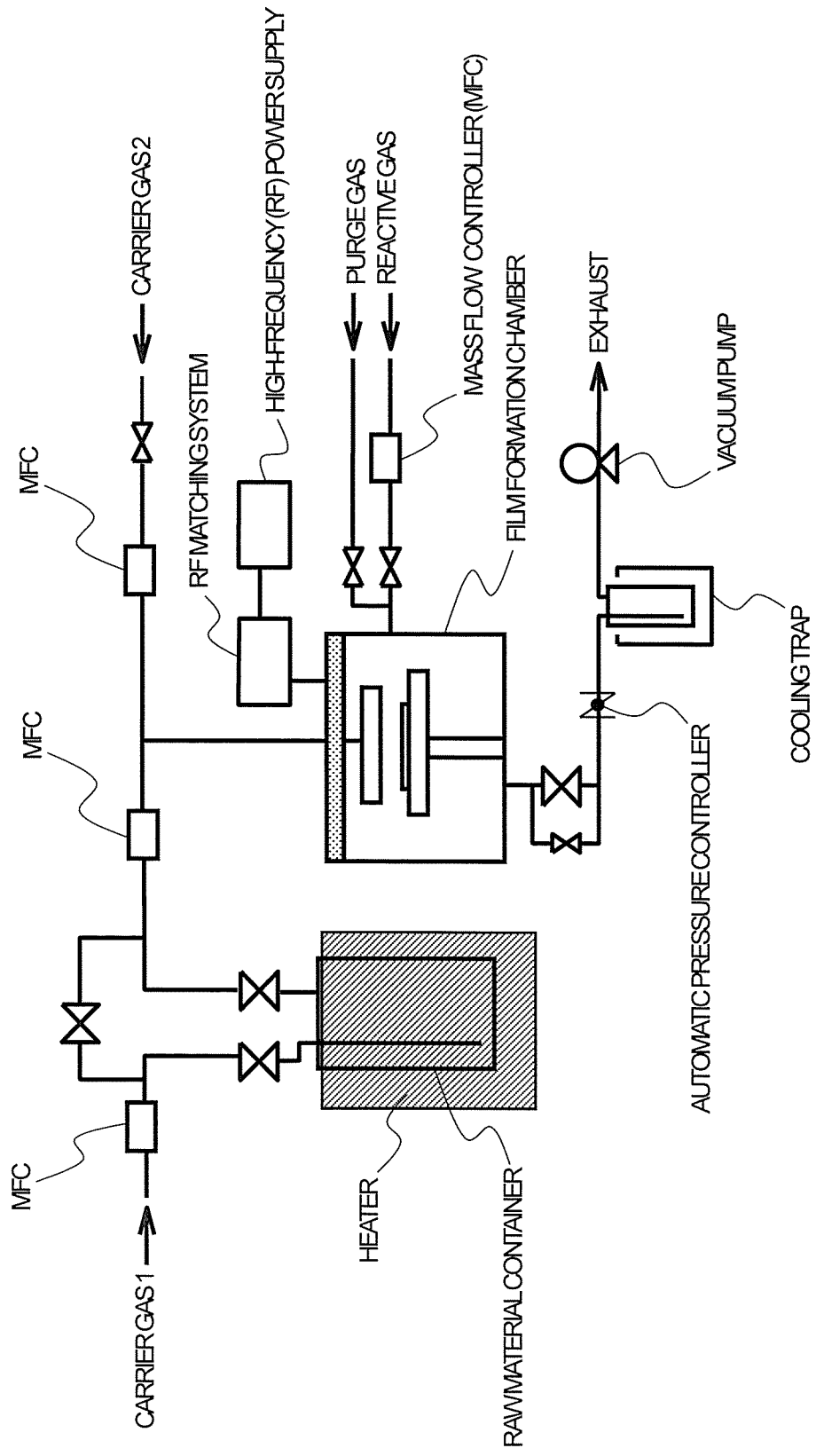
FIG. 3 is a conceptual diagram illustrating another example of a chemical vapor deposition apparatus for use in the method for manufacturing a thin film in the present invention.
Figure 4:
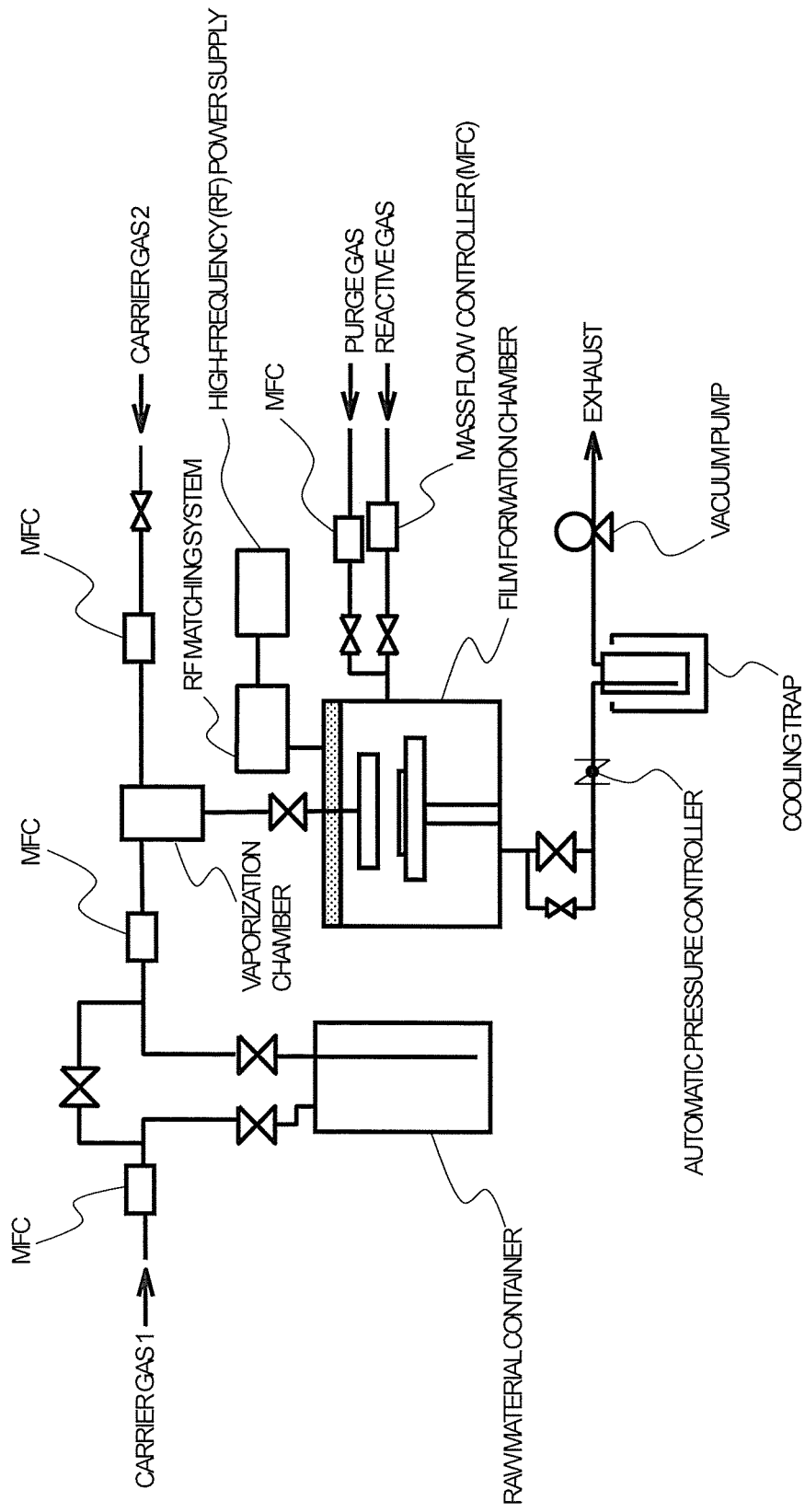
FIG. 4 is a conceptual diagram illustrating another example of a chemical vapor deposition apparatus for use in the method for manufacturing a thin film in the present invention.

A well-known chemical vapor deposition apparatus can be used for manufacturing a thin film by using the raw material for forming a thin film of the present invention. Specific examples of suitable apparatuses include an apparatus, such as depicted in FIG. 1, in which a precursor can be fed by bubbling, and an apparatus, such as depicted in FIG. 2, which has a vaporization chamber. An apparatus can be also used in which, as depicted in FIG. 3 and FIG. 4, plasma treatment can be performed with respect to a reactive gas. The single-substrate apparatuses, such as depicted in FIG. 1 to FIG. 4, are not limiting, and an apparatus which uses a batch furnace and is capable of simultaneous processing of a large number of substrates can be also used.

Where a thin film is manufactured using the raw material for forming a thin film of the present invention, the desired type of thin film such as metal, oxide ceramic, nitride ceramic, and glass can be formed by appropriately selecting the other precursor, reactive gas, and manufacturing conditions. Such thin films are known to exhibit various electric properties, optical properties and the like, and are used for a variety of applications. For example, such thin films are used for applications of semiconductors, photocells, TFTs and the like, in particular, are mainly used as high dielectric materials for semiconductor materials.

EXAMPLES

The present invention will be explained hereinbelow in greater detail with reference to Examples and Evaluation Examples. However, the present invention is not limited by the Examples, etc., below.

<Example 1> Manufacture of Thin Film of Zirconium Oxide by ALD Method

Compound No. 34 was used as a raw material for chemical vapor deposition, and a thin film of zirconium oxide was manufactured on a silicon substrate on which a groove having a diameter of 220 nm and a depth of 8600 nm (the aspect ratio of 39.1) was formed, by the ALD method under the below-described conditions by using the apparatus depicted in FIG. 1. Regarding the obtained thin film, the thickness was measured by an X-ray reflectance method, the cross-section was observed by an FE-SEM, and the thin film structure and thin film composition were verified by an X-ray diffraction method and an X-ray photoelectron spectroscopy. The film thickness on the portion where the groove was not formed was 3 nm to 6 nm, and the thin film was formed with a uniform thickness on the groove portion. The composition of the thin film was zirconium oxide (confirmed by Zr3d and O1s peaks in XPS analysis), and the amount of carbon in the thin film was less than the lower detection limit of 0.1 atom %. The film thickness obtained per one cycle was 0.02 nm to 0.04 nm.

(Conditions)

Reaction temperature (substrate temperature): 210° C., Reactive gas: ozone gas (Steps)

The series of the following steps (1) to (4) was taken as 1 cycle, and 150 cycles were performed.

(1) The vapor of a raw material for chemical vapor deposition that is vaporized under the conditions of a raw material container heating temperature of 140° C. and a raw material container pressure of 10 Pa is introduced, and deposition is performed for 20 seconds under a system pressure of 20 Pa.

(2) The unreacted raw material is removed by purging with argon for 30 seconds.

(3) A reactive gas is introduced and the reaction is conducted for 20 seconds under a system pressure of 20 Pa.

(4) The unreacted raw material is removed by purging with argon for 30 seconds.

<Comparative Example 1> Manufacture of Thin Film of Zirconium Oxide by ALD Method A thin film of zirconium oxide was manufactured on a silicon substrate under the same conditions as in Example 1 except that the following Comparative compound 1 was used as a raw material for chemical vapor deposition. Regarding the obtained thin film, the thickness was measured by an X-ray reflectance method, and the thin film structure and thin film composition were verified by an X-ray diffraction method and an X-ray photoelectron spectroscopy. Though the film thickness on the portion where the groove was not formed was 3 nm to 4 nm, the thin film was formed with an ununiform thickness on the groove portion (a thin film was substantially not formed on the bottom of the groove, and a thin film having a film thickness of 3 nm to 6 nm was formed on the portion other than the bottom of the groove). The composition of the thin film was zirconium oxide (confirmed by Zr3d and O1s peaks in XPS analysis), and the amount of carbon in the thin film was 8 atom %. The film thickness obtained per one cycle was 0.02 nm to 0.04 nm.

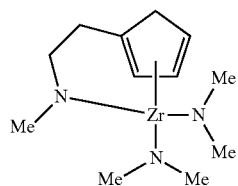

Comparative compound 1

<Comparative Example 2> Manufacture of Thin Film of Zirconium Oxide by ALD Method A thin film of zirconium oxide was manufactured on a silicon substrate under the same conditions as in Example 1 except that the following Comparative compound 2 was used as a raw material for chemical vapor deposition. Regarding the obtained thin film, the thickness was measured by an X-ray reflectance method, and the thin film structure and thin film composition were verified by an X-ray diffraction method and an X-ray photoelectron spectroscopy. Though the film thickness on the portion where the groove was not formed was 3 nm to 4 nm, the thin film was formed with an ununiform thickness on the groove portion (a thin film was substantially not formed on the bottom of the groove, and a thin film having a film thickness of 3 nm to 6 nm was formed on the portion other than the bottom of the groove). The composition of the thin film was zirconium oxide (confirmed by Zr3d and O1s peaks in XPS analysis), and the amount of carbon in the thin film was 8 atom %. The film thickness obtained per one cycle was 0.02 nm to 0.04 nm.

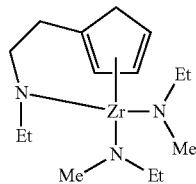

Comparative compound 2

In Example 1, a high-quality zirconium oxide thin film could be obtained. Further, since Compound No. 34 had high thermal stability, it was found that the compound could uniformly form a high-quality thin film even on the groove portion having a high aspect ratio on the silicon substrate.

On the other hand, Comparative example 1 and Comparative example 2 could not form a thin film with a uniform thickness on the groove portion having a high aspect ratio on the silicon substrate. Further, since many carbon components remained in the thin film, it was found that a high-quality zirconium oxide thin film could not be obtained.

<Example 2> Manufacture of Thin Film of Hafnium Oxide by ALD Method

Compound No. 58 was used as a raw material for chemical vapor deposition, and a thin film of hafnium oxide was manufactured on a silicon substrate on which a groove having a diameter of 220 nm and a depth of 8600 nm was formed, by the ALD method under the below-described conditions by using the apparatus depicted in FIG. 1. Regarding the obtained thin film, the thickness was measured by an X-ray reflectance method, the cross-section was observed by an FE-SEM, and the thin film structure and thin film composition were verified by an X-ray diffraction method and an X-ray photoelectron spectroscopy. The film thickness on the portion where the groove was not formed was 3 nm to 6 nm, and the thin film was formed with a uniform thickness on the groove portion. The composition of the thin film was hafnium oxide (confirmed by Hf4f and O1s peaks in XPS analysis), and the amount of carbon in the thin film was less than the lower detection limit of 0.1 atom %. The film thickness obtained per one cycle was 0.02 nm to 0.04 nm.

(Conditions)

Reaction temperature (substrate temperature): 280° C., Reactive gas: ozone gas (Steps)

The series of the following steps (1) to (4) was taken as 1 cycle, and 150 cycles were performed.

(1) The vapor of a raw material for chemical vapor deposition that is vaporized under the conditions of a raw material container heating temperature of 140° C. and a raw material container pressure of 10 Pa is introduced, and deposition is performed for 20 seconds under a system pressure of 20 Pa.
(2) The unreacted raw material is removed by purging with argon for 30 seconds.
(3) A reactive gas is introduced and the reaction is conducted for 20 seconds under a system pressure of 20 Pa.
(4) The unreacted raw material is removed by purging with argon for 30 seconds.

<Example 3> Manufacture of Thin Film of Hafnium Oxide by ALD Method

A thin film of hafnium oxide was manufactured on a silicon substrate under the same conditions as in Example 2 except that Compound No. 66 was used as a raw material for chemical vapor deposition. Regarding the obtained thin film, the thickness was measured by an X-ray reflectance method, the cross-section was observed by an FE-SEM, and the thin film structure and thin film composition were verified by an X-ray diffraction method and an X-ray photoelectron spectroscopy. The film thickness on the portion where the groove was not formed was 3 nm to 6 nm, and the thin film was formed with a uniform thickness on the groove portion. The composition of the thin film was hafnium oxide (confirmed by Hf4f and O1s peaks in XPS analysis), and the amount of carbon in the thin film was less than the lower detection limit of 0.1 atom %. The film thickness obtained per one cycle was 0.02 nm to 0.04 nm.

In Examples 2 and 3, high-quality hafnium oxide thin films could be obtained. Further, since Compounds No. 58 and No. 66 had high thermal stability, it was found that the compounds could uniformly form high-quality thin films even on the groove portion having a high aspect ratio on the silicon substrate.

The present international application claims priority from Japanese Patent Application No. 2016-102628 filed on May 23, 2016, the full contents whereof are incorporated herein by reference.

The invention claimed is:

1. A method for manufacturing a thin film, comprising: introducing a vapor including at least one compound selected from the group consisting of Compound No. 34 and Compound No. 66, which is obtained by vaporizing a raw material for forming a thin film that includes the at least one compound, into a film formation chamber in which a substrate is disposed; and forming, on a surface of the substrate, a thin film including at least one atom selected from the group consisting of zirconium and hafnium by inducing decomposition and/or chemical reaction of the at least one compound:

Compound No.34

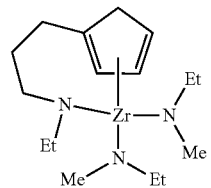

Compound No.66

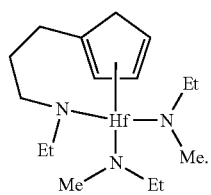

2. The method for manufacturing a thin film according to claim 1, wherein a groove having an aspect ratio of 10 to 200 is formed on the substrate.

3. A method for manufacturing a thin film, comprising: introducing a vapor including at least one compound selected from the group consisting of Compound No. 34 and Compound No. 66, which is obtained by vaporizing a raw material for forming a thin film by an ALD method that includes the at least one compound, into a film formation chamber in which a substrate is disposed; and forming, on a surface of the substrate, a thin film including at least one atom selected from the group consisting of zirconium and hafnium by inducing decomposition and/or chemical reaction of the at least one compound:

Compound No.34

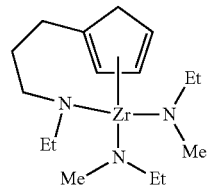

-continued
Compound No.66
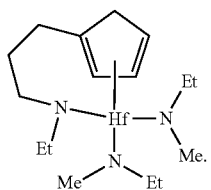
4. The method for manufacturing a thin film according to claim 3, wherein a groove having an aspect ratio of 10 to 200 is formed on the substrate.
* * * * *